(12) United States Patent
Zou et al.

(10) Patent No.: US 11,404,488 B2
(45) Date of Patent: Aug. 2, 2022

(54) TRANSPARENT DISPLAY PANEL AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Qinghua Zou, Beijing (CN); Ruhui Zhu, Beijing (CN); Tingyuan Duan, Beijing (CN); Fengli Wang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 350 days.

(21) Appl. No.: 16/620,948

(22) PCT Filed: May 14, 2019

(86) PCT No.: PCT/CN2019/086918
§ 371 (c)(1),
(2) Date: Dec. 10, 2019

(87) PCT Pub. No.: WO2020/015443
PCT Pub. Date: Jan. 23, 2020

(65) Prior Publication Data
US 2021/0367005 A1    Nov. 25, 2021

(30) Foreign Application Priority Data

Jul. 18, 2018    (CN) .......................... 201810808766.0

(51) Int. Cl.
*H01L 33/00*    (2010.01)
*H01L 21/00*    (2006.01)
(Continued)

(52) U.S. Cl.
CPC ...... *H01L 27/3218* (2013.01); *H01L 27/3213* (2013.01); *H01L 27/3246* (2013.01); *H01L 51/5218* (2013.01); *H01L 51/5237* (2013.01)

(58) Field of Classification Search
CPC ............ H01L 51/5271; H01L 51/5234; H01L 27/3213; H01L 27/3218
(Continued)

(56) References Cited

U.S. PATENT DOCUMENTS

| 8,587,000 | B2* | 11/2013 | Yamamoto | .......... H01L 51/5036 |
| | | | | 257/79 |
| 8,946,722 | B2* | 2/2015 | Kim | ...................... H01L 27/322 |
| | | | | 257/72 |

(Continued)

FOREIGN PATENT DOCUMENTS

| CN | 1622715 A | 6/2005 |
| CN | 1787216 A | 6/2006 |

(Continued)

OTHER PUBLICATIONS

Office Action for 201810808766.0 dated Jan. 22, 2021.
Office Action for corresponding Chinese application No. 201810808766.0 dated Nov. 4, 2020.

*Primary Examiner* — Calvin Lee
(74) *Attorney, Agent, or Firm* — ArentFox Schiff LLP; Michael Fainberg

(57) ABSTRACT

A transparent display panel and a display device are disclosed. The orthographic projection of light-emitting region of electroluminescent structure on a base substrate overlaps with the orthographic projection of the region of the pixel circuit on the base substrate to form an overlap region, so that the area occupied by the electroluminescent structures in the sub-pixels is enlarged, thus increasing the pixel
(Continued)

aperture ratio of the transparent display panel at the sides, away from the pixel circuits, of the electroluminescent structures.

9 Claims, 8 Drawing Sheets

(51) Int. Cl.
*H01L 27/32* (2006.01)
*H01L 51/52* (2006.01)

(58) Field of Classification Search
USPC .................................. 438/29, 69; 257/98
See application file for complete search history.

(56) References Cited

U.S. PATENT DOCUMENTS

| | | | |
|---|---|---|---|
| 9,035,288 B2* | 5/2015 | Kim | H01L 51/5218 257/40 |
| 9,059,424 B2* | 6/2015 | Ko | H01L 51/5206 |
| 9,247,614 B2* | 1/2016 | Lee | H01L 27/322 |
| 9,263,502 B2* | 2/2016 | Heo | H01L 27/322 |
| 9,496,322 B1* | 11/2016 | Zou | H01L 27/124 |
| 9,614,018 B2* | 4/2017 | Shi | H01L 27/3246 |
| 9,722,000 B2* | 8/2017 | Kim | H01L 51/5281 |
| 2004/0135148 A1 | 7/2004 | Lin | |
| 2005/0110023 A1 | 5/2005 | Lee et al. | |
| 2012/0169683 A1 | 7/2012 | Hong | |
| 2015/0102306 A1 | 4/2015 | Shi et al. | |
| 2016/0149156 A1 | 5/2016 | Kim et al. | |
| 2016/0190225 A1 | 6/2016 | Kim et al. | |
| 2016/0268362 A1 | 9/2016 | Shi et al. | |
| 2017/0263883 A1 | 9/2017 | Xu | |

FOREIGN PATENT DOCUMENTS

| | | | |
|---|---|---|---|
| CN | 1967863 A | 5/2007 | |
| CN | 103474448 A | 12/2013 | |
| CN | 203398117 U | 1/2014 | |
| CN | 103730484 A | 4/2014 | |
| CN | 105140414 A | 12/2015 | |
| CN | 105633297 A | 6/2016 | |
| CN | 105742324 A | 7/2016 | |
| JP | 2004/031324 | * 1/2007 | H05B 33/24 |

\* cited by examiner

TRANSPARENT DISPLAY PANEL AND DISPLAY DEVICE

CROSS REFERENCE TO RELATED APPLICATIONS

This application is a US National Stage of International Application No. PCT/CN2019/086918, filed May 14, 2019, which claims priority to Chinese Patent Application No. 201810808766.0, filed with the Chinese Patent Office on Jul. 18, 2018, and titled "Transparent Display Panel and Display Device", the contents of which are incorporated herein by reference in its entirety.

FIELD

The disclosure relates to the technical field of display, in particular to a transparent display panel and a display device.

BACKGROUND

Organic light emitting diode (OLED) display panels have the advantages of self-illumination, being free from backlight, small thickness, large view angle, high response speed, and the like, thereby having gained extensive attention. An existing transparent OLED display panel generally includes a plurality of sub-pixels each including an electroluminescent structure and a pixel circuit used for driving the electroluminescent structure to emit light. For the sake of transparent display, each electroluminescent structure typically includes a transparent anode layer, an electroluminescent layer and a transparent cathode layer which are arranged in a stacked manner. In this way, the regions where the electroluminescent structures are located are transparent light-emitting regions of the transparent OLED display panels, and the regions where the pixel circuits are located generally serve as non-transparent regions, thus resulting in a decrease of the pixel aperture ratio of one side of the transparent OLED display panels.

SUMMARY

This disclosure provides a transparent display panel. The transparent display panel includes: a base substrate, wherein a plurality of sub-pixels are on the base substrate; a plurality of pixel circuits, located respectively in the sub-pixels; and a plurality of electroluminescent structures, located respectively in the sub-pixels and stacked on the pixel circuits, wherein a light-emitting region of at least one of the electroluminescent structures include a transparent region and an overlap region, and the overlap region is a region where an orthographic projection of the light-emitting region on the base substrate and an orthographic projection of a region of the pixel circuit on the base substrate overlaps with each other.

In a specific implementation, in the embodiment of this disclosure, the transparent display panel further includes a reflection layer in at least one of the sub-pixels; wherein at least one of the electroluminescent structures includes an anode layer, an electroluminescent layer and a transparent cathode layer which are stacked; the reflection layer is between a layer of the pixel circuit and the electroluminescent layer; and in the same sub-pixel, the orthographic projection of the reflection layer on the base substrate covers the overlap region.

In a specific implementation, in the embodiment of this disclosure, the anode layer is a transparent anode layer which is arranged in the whole light-emitting region; and the reflection layer is between the transparent anode layer and the layer of the pixel circuit and is float.

In a specific implementation, in the embodiment of this disclosure, the anode layer is a transparent anode layer which is arranged in the whole light-emitting region, and the reflection layer is electrically connected to the anode layer.

In a specific implementation, in the embodiment of this disclosure, the reflection layer is between the anode layer and the layer of the pixel circuit.

In a specific implementation, in the embodiment of this disclosure, the transparent display panel further includes a first insulation layer between the reflection layer and the layer of the pixel circuit, and a second insulation layer between the reflection layer and the anode layer; and in the same sub-pixel, the anode layer is electrically connected to the reflection layer through a first via hole penetrating through the second insulation layer.

In a specific implementation, in the embodiment of this disclosure, the reflection layer is in direct contact with the anode layer.

In a specific implementation, in the embodiment of this disclosure, the reflection layer is between the anode layer and the electroluminescent layer.

In a specific implementation, in the embodiment of this disclosure, the anode layer includes a first transparent anode sub-layer and a second transparent anode sub-layer which are stacked; and the reflection layer is between the first transparent anode sub-layer and the second transparent anode sub-layer.

In a specific implementation, in the embodiment of this disclosure, the anode layer is a transparent anode layer which is only arranged in the transparent region, and the reflection layer is electrically connected to the transparent anode layer and serves as a reflective anode layer.

In a specific implementation, in the embodiment of this disclosure, the reflection layer is electrically connected to the transparent cathode layer.

In a specific implementation, in the embodiment of this disclosure, the reflection layer is between the anode layer and the layer of the pixel circuit; the transparent display panel further includes a first insulation layer between the reflection layer and the layer of the pixel circuit, a second insulation layer between the reflection layer and the anode layer, and a pixel defining layer in each of the sub-pixels; and the transparent cathode layer is electrically connected to the reflection layer through a second via holes penetrating through the pixel defining layers and the second insulation layers.

In a specific implementation, in the embodiment of this disclosure, an orthographic projection of the reflection layer on the base substrate coincides with the overlap region.

In a specific implementation, in the embodiment of this disclosure, a material of the reflection layer includes one or a combination of Al, Ag and Mo.

In a specific implementation, in the embodiment of this disclosure, in the same sub-pixel, the orthographic projection of the light-emitting region of the electroluminescent structure on the base substrate covers the orthographic projection of the region of the pixel circuit on the base substrate.

In a specific implementation, in the embodiment of this disclosure, the colors of light emitted by the electroluminescent layers in all the sub-pixels include: red, green and blue; red, green, blue and white; or white.

In a specific implementation, in the embodiment of this disclosure, the transparent display panel further includes an encapsulation structure covering the pixel circuits and the electroluminescent structures; the encapsulation structure includes: a thin film encapsulation structure, a glass encapsulation structure, or a soft substrate encapsulation structure.

Correspondingly, this disclosure further provides a display device including the transparent display panel.

BRIEF DESCRIPTION OF THE DRAWINGS

FIG. 1b is a sectional view of the transparent OLED display panel shown in FIG. 1a;

DETAILED DESCRIPTION

Figure 1A:
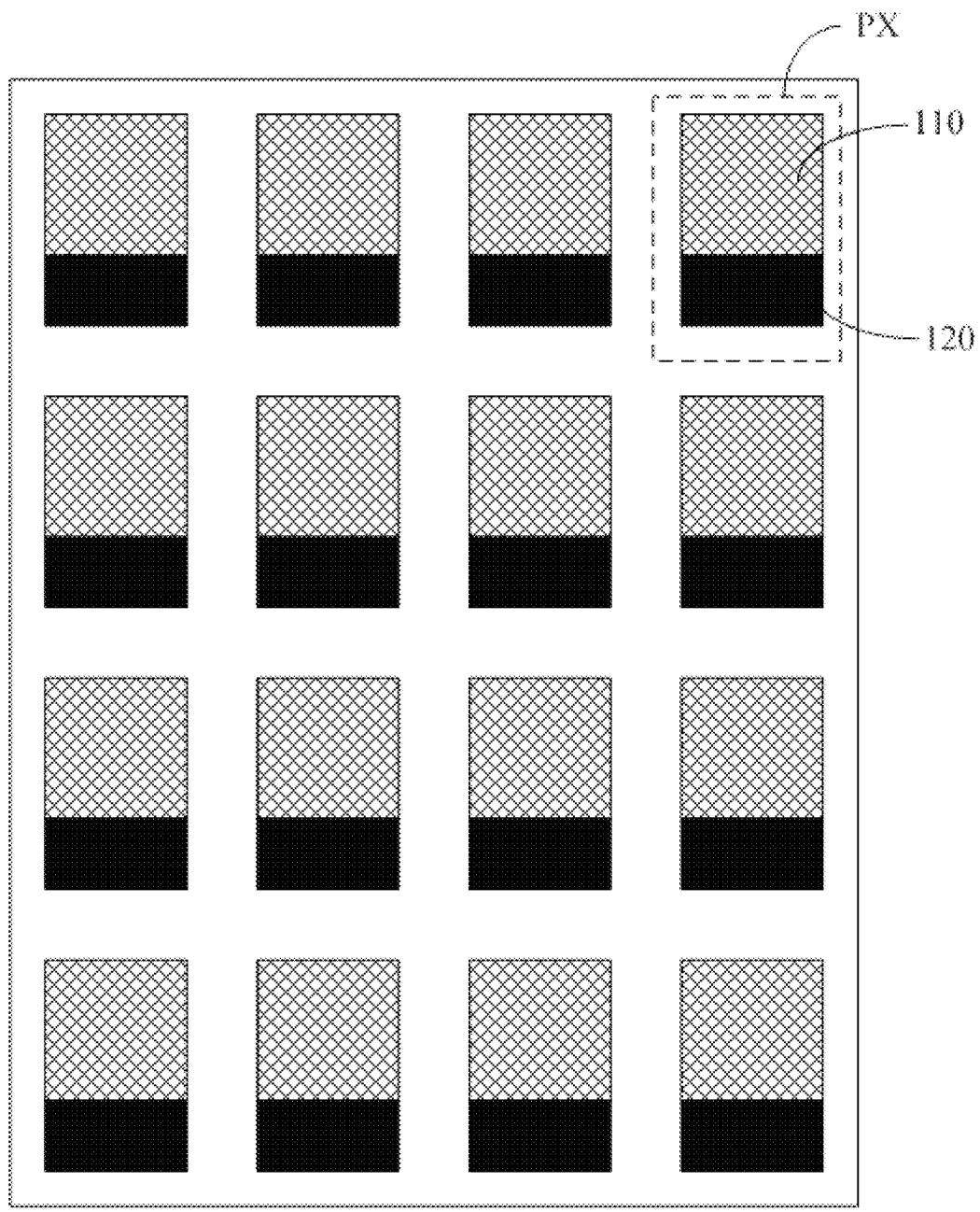
FIG. 1a is a top view of a transparent OLED display panel in the related art.
Figure 1B:
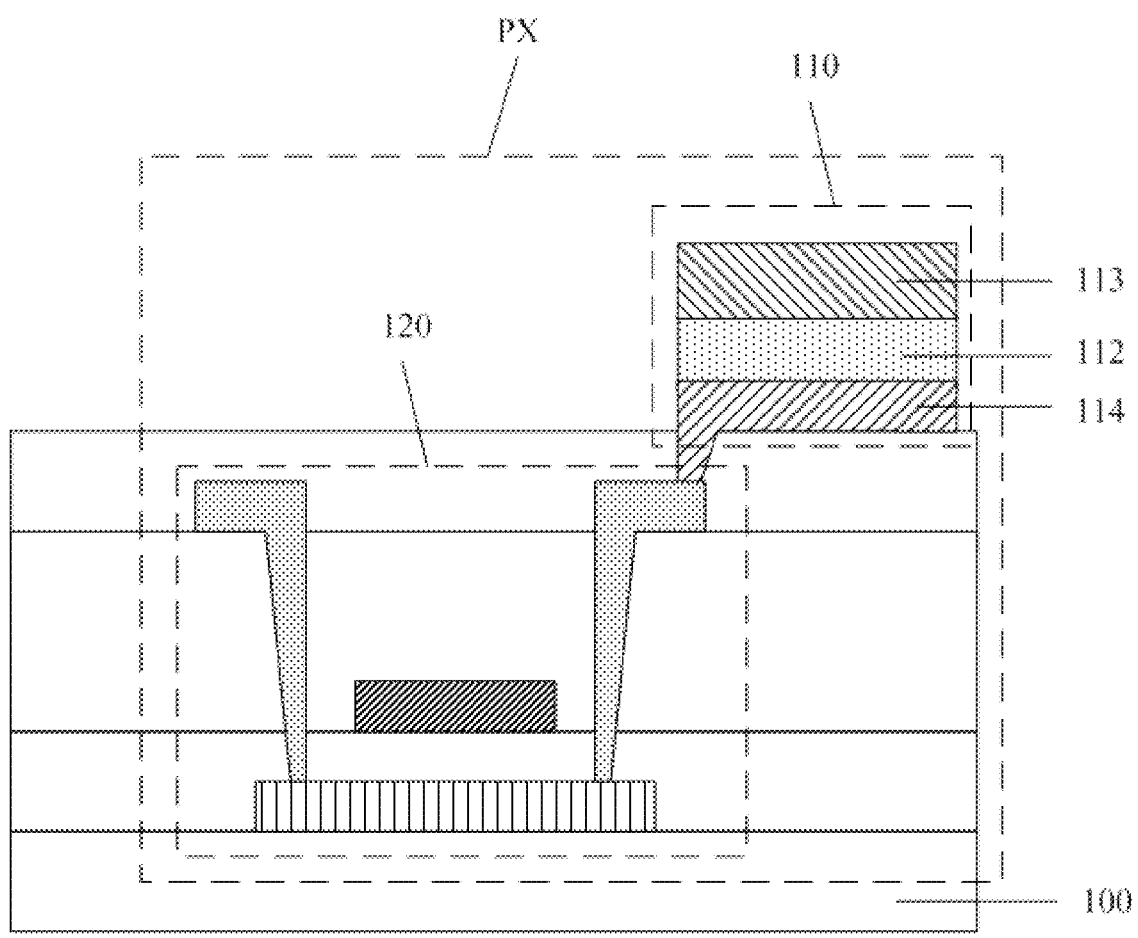

As shown in FIG. 1a and FIG. 1b, a transparent OLED display panel typically includes a plurality of pixel units. Each pixel unit includes a plurality of sub-pixels PX. Each sub-pixel PX includes an electroluminescent structure 110 and a pixel circuit 120 configured to drive the electroluminescent structure 110 to emit light. In order to achieve transparent display, each electroluminescent structure 110 generally includes a transparent anode layer 114, an electroluminescent layer 112 and a transparent cathode layer 113 stacked. In this way, the regions where the electroluminescent structures 110 are located are transparent regions in the transparent OLED display panel. In order to improve the display effect, the regions where the pixel circuits 120 are located are non-transparent regions. However, due to the fact that the electroluminescent structures 110 and the pixel circuits 120 are stacked on a base substrate 100, the pixel aperture ratio of the transparent OLED display panel at the sides of the electroluminescent structures 110 away from the pixel circuits 120 is limited by the regions where the pixel circuits 120 are located, thus imposing an adverse influence on the increase of the pixel aperture ratio.

This disclosure provides a transparent display panel, to increase the pixel aperture ratio.

In order to make the objects, technical solutions and advantages of this disclosure more clear, specific implementations of a transparent display panel and a display device according to this disclosure are described in detail below in conjunction with the accompanying drawings. It should be understood that the preferred embodiments in the following description are used for illustrating and explaining this disclosure only, and are not intended to limit this disclosure. The embodiments in this application and the characteristics in these embodiments can be combined without causing any confliction. It should be noted that the thicknesses, sizes and shapes of all layers in the drawings do not reflect the actual scale of the transparent display panel, and are intended to provide an illustrative description of the contents of this disclosure only. In the whole application, identical or similar reference signs represent identical or similar elements, or elements with identical or similar functions.

Figure 2A:
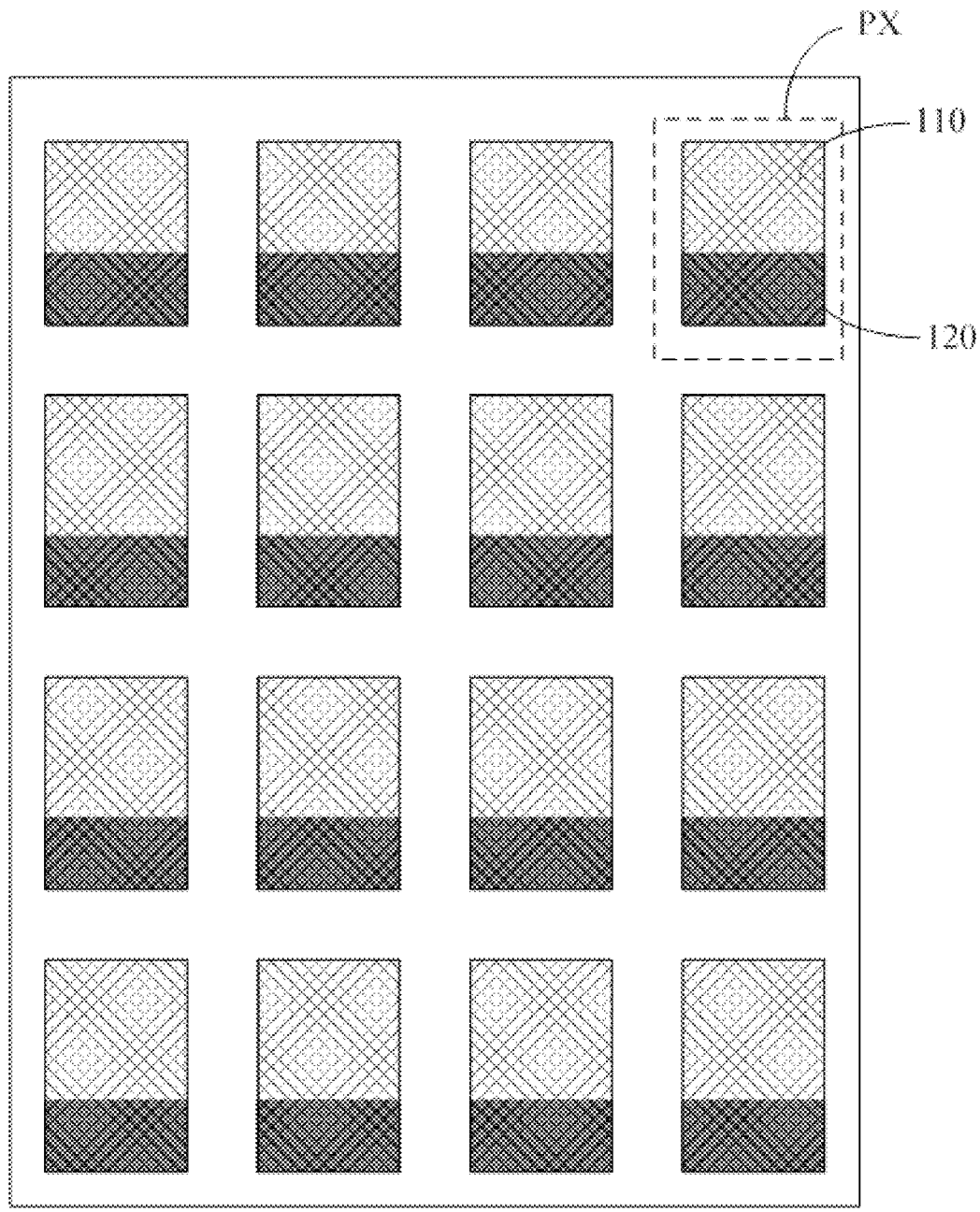
FIG. 2a is a top view of a transparent display panel in an embodiment of this disclosure.
Figure 2B:
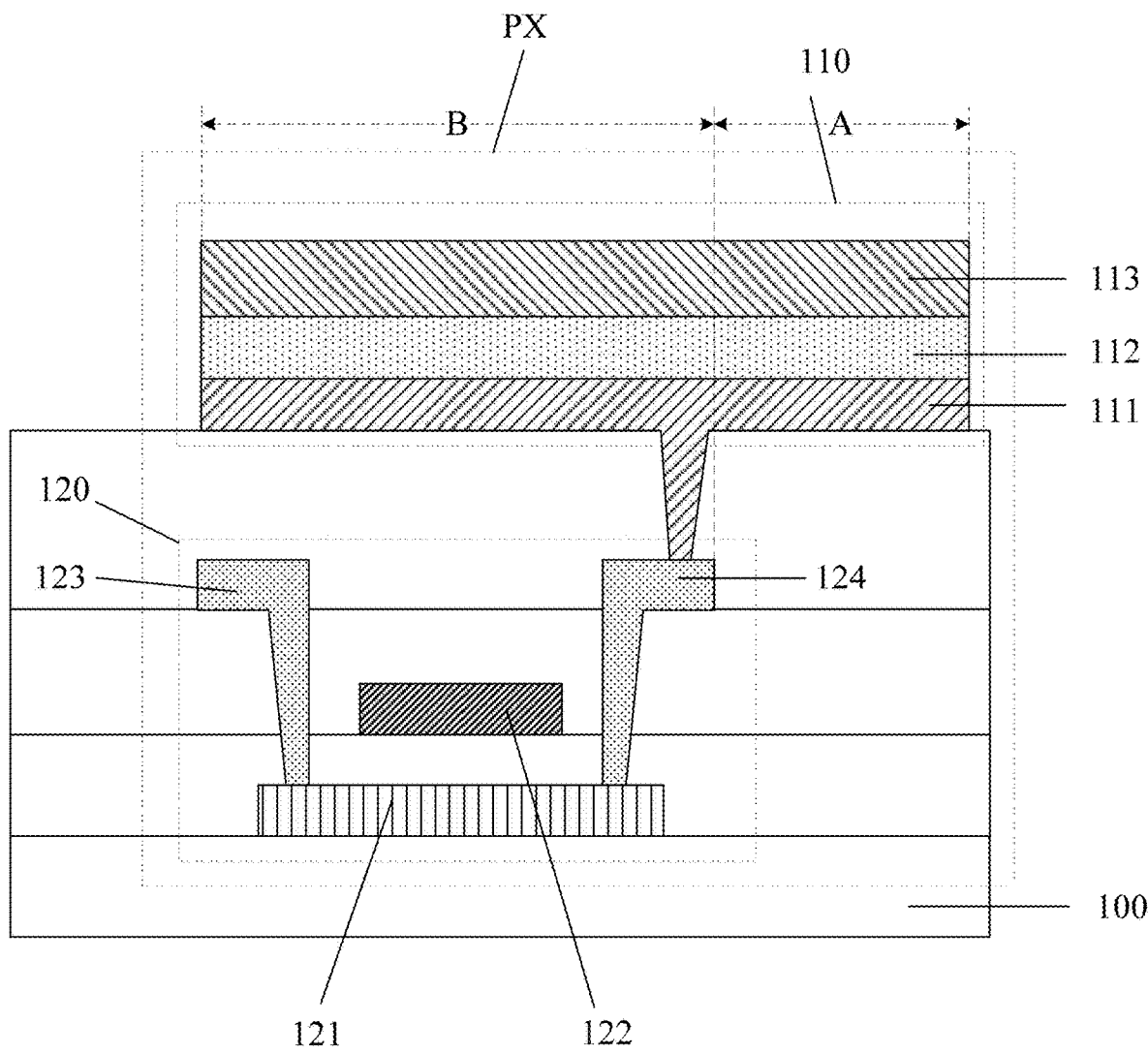
FIG. 2b is a schematic partial sectional diagram of a transparent display panel in an embodiment of this disclosure.

This disclosure provides a transparent display panel. As shown in FIG. 2a and FIG. 2b, the transparent display panel may include: a base substrate 100, wherein a plurality of sub-pixels PX are arranged on the base substrate; a plurality of pixel circuits 120, each located in the sub-pixel PX; electroluminescent structures 110, each located in the sub-pixel PX and the electroluminescent structure and the corresponding pixel circuit 120 are stacked, wherein the pixel circuit 120 is configured to drive the electroluminescent structure 110 to emit light. The light-emitting region of the electroluminescent structure 110 include a transparent region A and an overlap region B, and the overlap region B is a region where the orthographic projection of the light-emitting region on the base substrate 100 and the orthographic projection of the region of the pixel circuit 120 on the base substrate 100 overlap with each other, that is, the orthographic projection of the light-emitting region of the electroluminescent structure 110 on the base substrate 100 overlaps with the orthographic projection of the region of the pixel circuit 120 on the base substrate 100 to form the overlap regions B; and all layers in the transparent region A of the electroluminescent structure 110 are transparent.

In the transparent display panel according to this disclosure, the overlap regions B are formed by overlapping of the orthographic projections of the light-emitting regions of the electroluminescent structures 110 on the base substrate 100 and the orthographic projections of the regions of the pixel circuits 120 on the base substrate 100, the area occupied by the electroluminescent structures 110 in the sub-pixels PX is enlarged, thus, increasing the pixel aperture ratio of the transparent display panel at the sides of the electroluminescent structures 110 away from the pixel circuits 120.

This disclosure will be described in detail below in combination with embodiments. It should be noted that, the following embodiments are used for providing a better explanation of this disclosure only, and are not intended to limit this disclosure.

Embodiment 1

In a specific implementation, in the embodiment of this disclosure, as shown in FIG. 2b, an electroluminescent structure 110 may include an anode layer 111, an electroluminescent layer 112 and a transparent cathode layer 113 which are stacked. A pixel circuit 120 may include a storage capacitor and a transistor. The transistor may include an active layer 121 on the base substrate 100, a gate 122 insulated from the active layer 121, and a source 123 and a drain 124 which are insulated from the gate 122 and electrically connected to the active layer 121. The drain 124 is electrically connected to the anode layer 111 in the electroluminescent structure 110. A gate insulation layer is arranged between the layer where the active layer 121 is located and the layer where the gate 122 is located to realize insulation; and an inter-layer dielectric layer is arranged between the layer where the source 123 and the drain 124 are located and the layer where the gate 122 is located to realize insulation. It should be noted that in FIG. 2b, only the structure of one transistor in the pixel circuit 120 is taken as an example for explaining. In actual application, the specific structure of the pixel circuit is basically identical with that of circuits in the related art and thus will not be repeated anymore herein.

In a specific implementation, in the embodiment of this disclosure, the material of the transparent cathode layer 113 may include the inorganic conductive material such as one or a combination of Mg, Ag, and IZO. In actual application, Mg and Ag can be used to prepare thin transparent cathode layer 113 through an evaporation process, so that the cathode layer is made transparent.

In a specific implementation, in the embodiment of this disclosure, the material of the electroluminescent layer 112 may include an electroluminescent material such as an organic micro-molecular luminescent material, an organic macro-molecular luminescent material or an organic complex luminescent material. When actually prepared, the electroluminescent layer can be formed through an evaporation process or an ink-jet printing process. Each electroluminescent structure 112 may further include a hole injection layer arranged between the anode layer and the electroluminescent layer, a hole transport layer arranged between the hole injection layer and the electroluminescent layer, an electron injection layer arranged between the transparent cathode layer and the electroluminescent layer, and an electron transport layer arranged between the electron injection layer and the electroluminescent layer.

In a specific implementation, in the embodiment of this disclosure, the anode layer 111 may be a transparent anode layer arranged in the whole light-emitting region, that is, the anode layer 111 with the orthographic projection located in the overlap region B can also be transparent. In addition, the anode layer 111 includes a single transparent conductive layer which is made from one or a combination of indium tin oxide (ITO) and indium zinc oxide (IZO). Or each anode layer 111 may also include a plurality of transparent conductive layers which are stacked. For instance, each anode layer 111 may include a first transparent anode sub-layer and a second transparent anode sub-layer which are stacked, wherein the first transparent anode sub-layer and the second transparent anode sub-layer can be made from one or a combination of ITO and IZO. Certainly, each anode layer 111 may also include a first transparent anode sub-layer, a second transparent anode sub-layer and a third transparent anode sub-layer which are stacked, wherein the first transparent anode sub-layer and the third transparent anode sub-layer can be made from one or a combination of ITO and IZO, and the second transparent anode sub-layer can be made from Ag.

In a specific implementation, in the embodiment of this disclosure, the sub-pixels PX may include red sub-pixels, green sub-pixels and blue sub-pixels. Or, the sub-pixels may also include red sub-pixels, green sub-pixels, blue sub-pixels and white sub-pixels. Or, the sub-pixels may include white sub-pixels only. This disclosure will not be limited thereto. That is, the colors of light emitted by the electroluminescent layers 112 in all the sub-pixels PX include red, green and blue; or, red, green, blue and white; or, white.

In a specific implementation, in the embodiment of this disclosure, the transparent display panel further includes an encapsulation structure covering the pixel circuits 120 and the electroluminescent structures 110, wherein the encapsulation structure includes a film encapsulation, glass encapsulation, or a soft substrate encapsulation, and this disclosure will not be limited thereto.

Figure 3A:
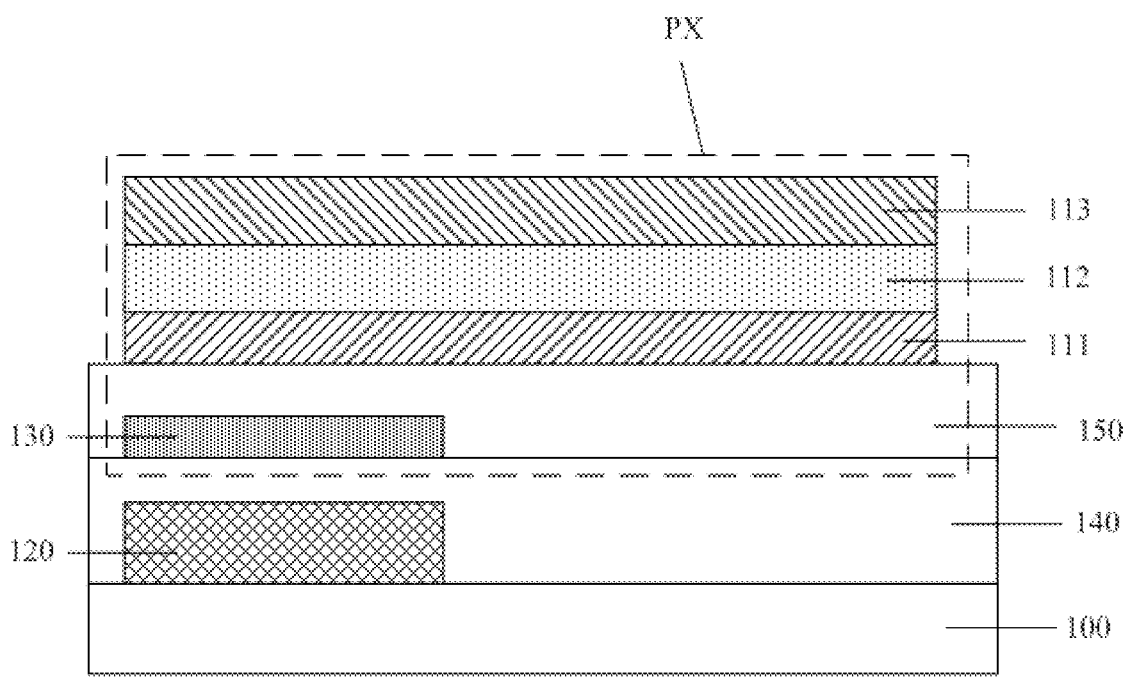
FIG. 3a is a schematic partial sectional diagram of a transparent display panel in an embodiment of this disclosure.

In a specific implementation, in the embodiment of this disclosure, in order to prevent the transistors in the pixel circuits from being affected by light and to improve the display brightness, as shown in FIG. 3a, the transparent display panel may further include reflection layers 130 located respectively in the sub-pixels PX, wherein the reflection layer 130 may be located between the layer of the pixel circuit 120 and the electroluminescent layer 112. In the same sub-pixel PX, the orthographic projection of the reflection layer 130 on the base substrate 100 covers the overlap region B. In this way, a resonant cavity is formed by the reflection layer 130 and the transparent cathode layer 113, so that the electroluminescent structure 110 can emit more light in the overlap regions B to the transparent cathode layer 11, thus improving the display brightness of the transparent display panel at the side of the electroluminescent structure 110 away from the pixel circuit 120. It should be noted that in FIG. 3a, the content of the this application is explained by taking the pixel circuit 120 as a whole as an example, and the specific structure of the transistor in the pixel circuit 120 is not shown.

Furthermore, in a specific implementation, in the embodiment of this disclosure, as shown in FIG. 3a, the reflection layer 130 may be located between the anode layer 111 and the layer of the pixel circuit 120 and may be float, that is, the reflection layer 130 is not loaded with electric signals. In addition, in order to prevent electrical connection between the reflection layer 130 and the pixel circuit 120, the transparent display panel may further include a first insulation layer 140 between the reflection layer 130 and the layer of the pixel circuit 120, and a second insulation layer 150 between the reflection layer 130 and the anode layer 111.

Furthermore, in a specific implementation, in the embodiment of this disclosure, the material of reflection layer 130 can include a metal, a metal alloy, or stacked metals. For example, the material of the reflection layer 130 can include one or a combination of Al, Ag and Mo.

Furthermore, in a specific implementation, in the embodiment of this disclosure, as shown in FIG. 3a, the orthographic projection of the reflection layer 130 on the base substrate 100 coincides with the overlap region B, so that the transparent region A is prevented from being shielded by the reflection layer 130.

Furthermore, in a specific implementation, in the embodiment of this disclosure, as shown in FIG. 2a and FIG. 3a, in the same sub-pixel PX, the orthographic projection of the electroluminescent structure 110 on the base substrate 100 covers the orthographic projection of the pixel circuit 120 on the base substrate 100, so that the region where the electroluminescent structure 110 is located is maximized, thus increasing the aperture ratio of the sub-pixels.

Embodiment 2

Figure 3B:
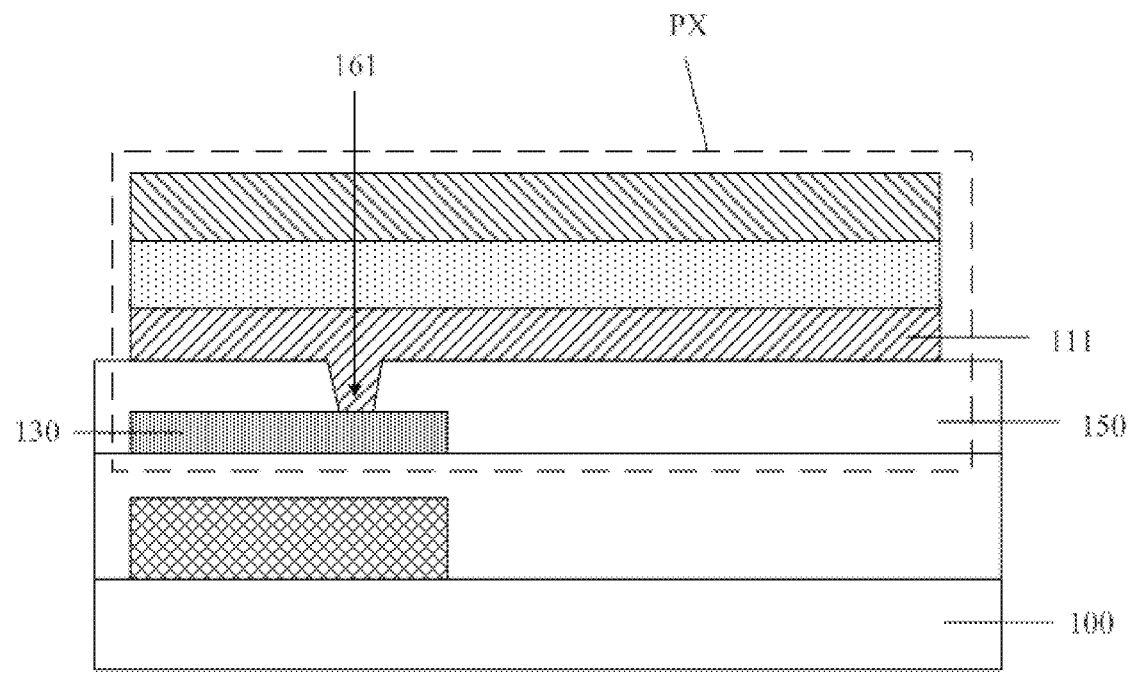
FIG. 3b is a schematic partial sectional diagram of a transparent display panel in an embodiment of this disclosure.

FIG. 3b shows a schematic structural diagram of a transparent display panel corresponding to this embodiment, in which the implementation of the reflection layer 130 in Embodiment 1 is modified. Only the differences of this embodiment from Embodiment 1 are explained below, and the similarities of this embodiment to Embodiment 1 are not repeated herein.

In a specific implementation, in the embodiment of this disclosure, as shown in FIG. 3b, the reflection layer 130 may be electrically connected to the anode layer 111 and may be located between the anode layer 111 and the layer of the pixel circuit 120. Specifically, in the same sub-pixel PX, the anode layer 111 may be electrically connected to the reflection layer 130 via a first via hole 161 penetrating through the second insulation layer 150, so that the resistance of the anode layer 111 can be reduced, and the electrical conductivity of the anode layer 111 can be improved. The orthographic projection of the first via hole 161 on the base substrate 100 is located within the orthographic projection of the reflection layer 130 on the base substrate 100.

Embodiment 3

Figure 3C:
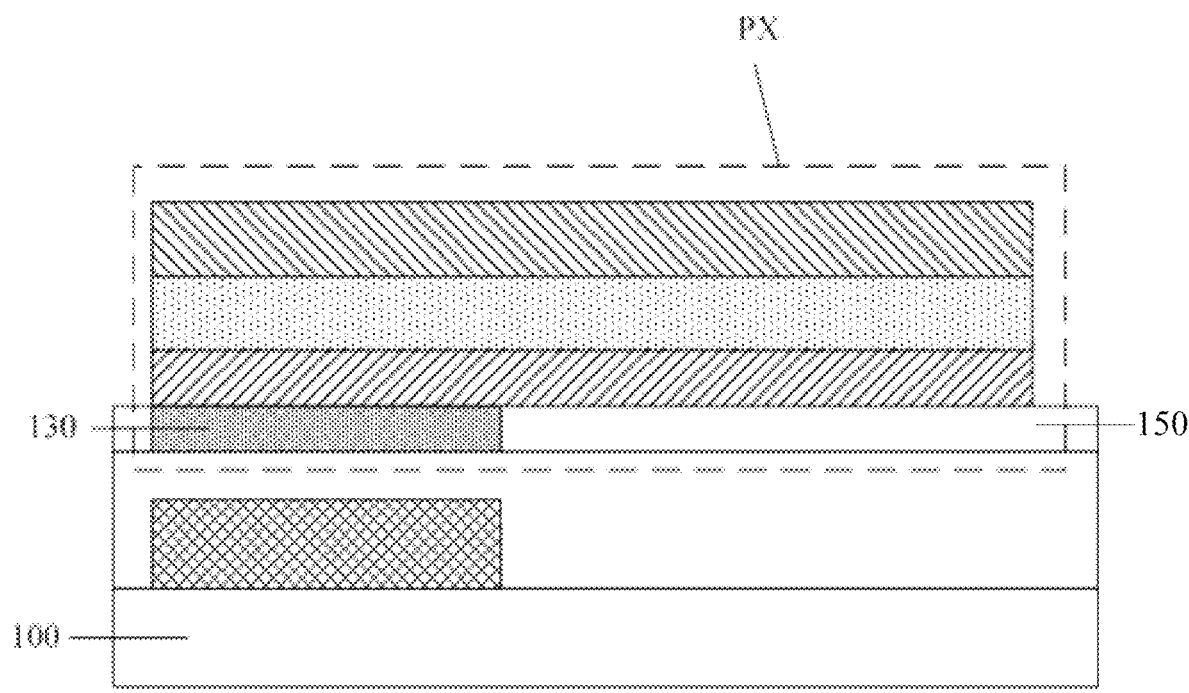
FIG. 3c is a schematic partial sectional diagram of a transparent display panel in an embodiment of this disclosure.

FIG. 3c shows a schematic structural diagram of a transparent display panel corresponding to this embodiment in which the implementation of connection between the reflection layer 130 and the anode layer 111 in Embodiment 2 is modified. Only the differences of this embodiment from Embodiment 2 are explained below, and the similarities of this embodiment to Embodiment 2 are not repeated herein.

In a specific implementation, in the embodiment of this disclosure, as shown in FIG. 3c, the side of the reflection layer 130 away from the base substrate 100 is completely adjacent to the anode layer 111, that is, the reflection layer 130 is in direct contact with the anode layer 111 and is directly arranged under the anode layer 111. The orthographic projection of the second insulation layer 150 on the base substrate does not overlap with the orthographic projection of the reflection layer 130 on the base substrate, and the second insulation layer 150 can play a planarization effect, so that the resistance of the anode layer 111 can be further reduced, and the electrical conductivity of the anode layer 111 can be further improved.

Embodiment 4

Figure 3D:
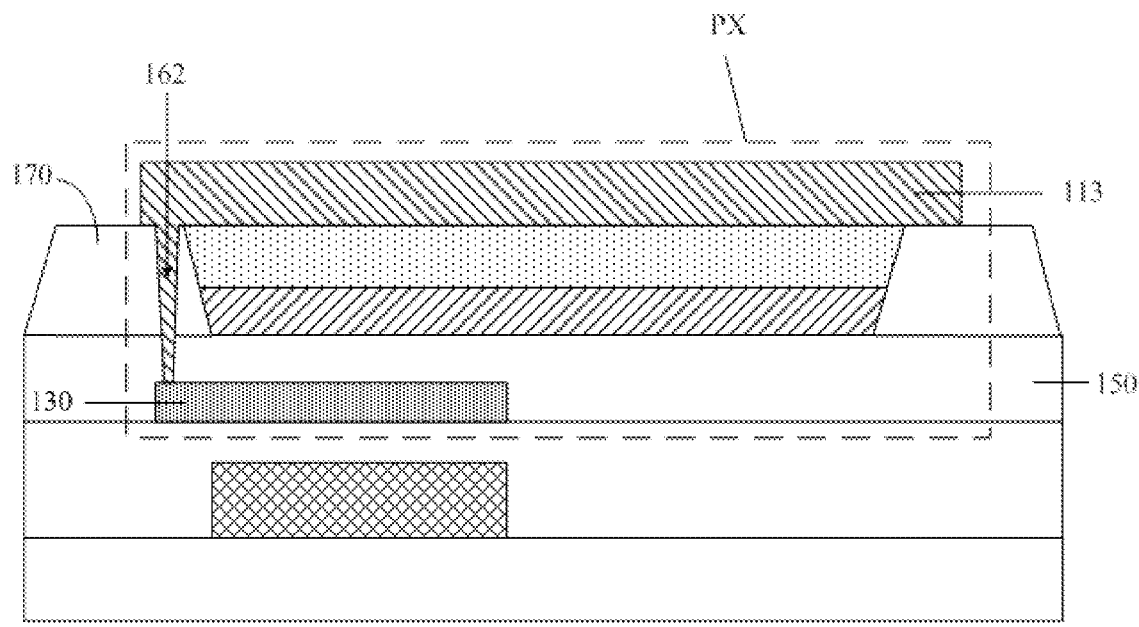
FIG. 3d is a schematic partial sectional diagram of a transparent display panel in an embodiment of this disclosure.

FIG. 3d shows a schematic structural diagram of a transparent display panel corresponding to this embodiment, in which the implementation of the reflection layer 130 in Embodiment 1 is modified. Only the differences of this embodiment from Embodiment 1 are explained below, and the similarities of this embodiment to Embodiment 1 are not repeated herein.

In a specific implementation, in the embodiment of this disclosure, as shown in FIG. 3d, the reflection layer 130 may be electrically connected to the transparent cathode layer 113 and may be located between the anode layer 111 and the layer of the pixel circuit 120. The transparent display panel may further include pixel defining layers 170 respectively located in the sub-pixels PX, so that the light-emitting regions of the electroluminescent structures 110 can be separated. In addition, in a specific implementation, the transparent cathode layer 113 may be electrically connected to the reflection layer 130 via a second via hole 162 penetrating through the pixel defining layer 170 and the second insulation layer 150, so that the reflection layer 130 can be used as an auxiliary cathode layer, thus the resistance of the transparent cathode layer 113 can be reduced, and the electrical conductivity of the transparent cathode layer 113 can be improved.

Embodiment 5

Figure 3E:
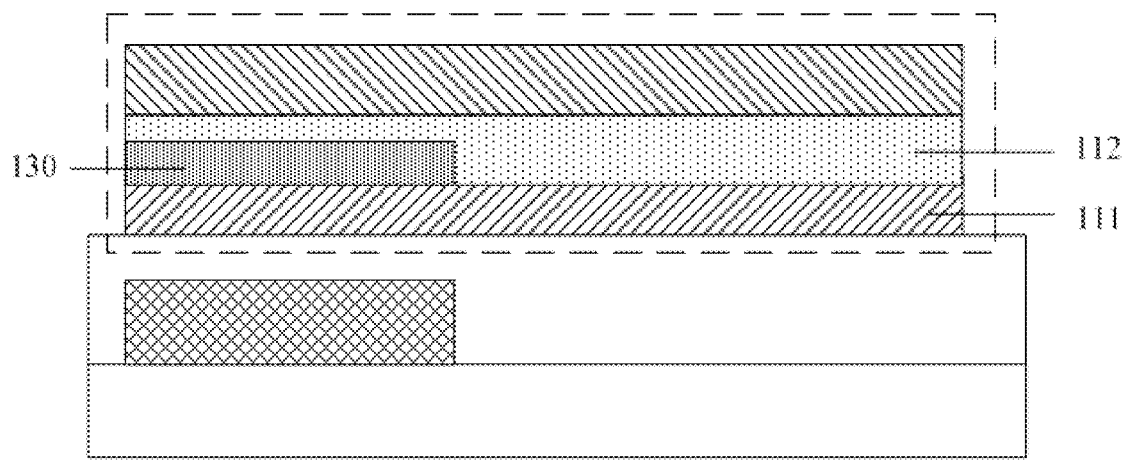
FIG. 3e is a schematic partial sectional diagram of a transparent display panel in an embodiment of this disclosure.

FIG. 3e shows a schematic structural diagram of a transparent display panel corresponding to this embodiment, in which the implementation of the reflection layer 130 in Embodiment 1 is modified. Only the differences of this embodiment from Embodiment 1 are explained below, and the similarities of this embodiment to Embodiment 1 are not repeated herein.

In a specific implementation, in the embodiment of this disclosure, as shown in FIG. 3e, the reflection layer 130 may be located between the anode layer 111 and the electroluminescent layer 112, so that the resistance of the anode layer 111 can be reduced, and the electrical conductivity of the anode layer 111 can be improved.

Embodiment 6

Figure 3F:
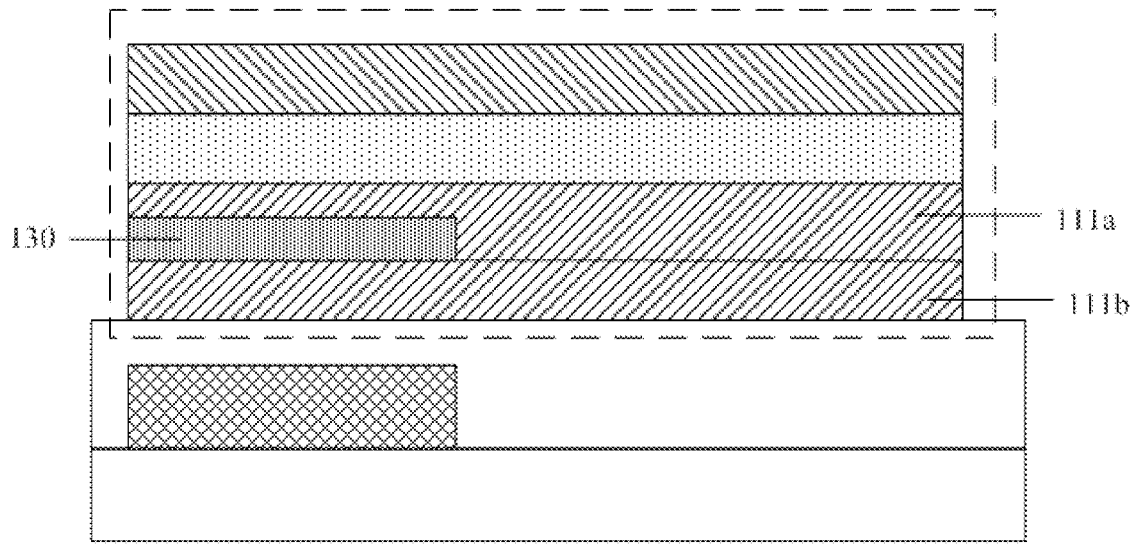
FIG. 3f is a schematic partial sectional diagram of a transparent display panel in an embodiment of this disclosure.

FIG. 3f shows a schematic structural diagram of a transparent display panel corresponding to this embodiment, in which the implementation of the reflection layer 130 in Embodiment 1 is modified. Only the differences of this embodiment from Embodiment 1 are explained below, and the similarities of this embodiment to Embodiment 1 are not repeated herein.

In a specific implementation, in the embodiment of this disclosure, as shown in FIG. 3f, the anode layer 111 is a transparent anode layer. Specifically the anode layer 111 may include a first transparent anode sub-layer 111a and a second transparent anode sub-layer 111b which are stacked. The material of the first transparent anode sub-layer 111a and the second transparent anode sub-layer 111b can include one or a combination of ITO or IZO. The reflection layer 130 may be located between the first transparent anode sub-layer 111a and the second transparent anode sub-layer 111b, so that the resistance of the anode layer 111 can be reduced, and the electrical conductivity of the anode layer 111 can be improved.

Embodiment 7

Figure 3G:
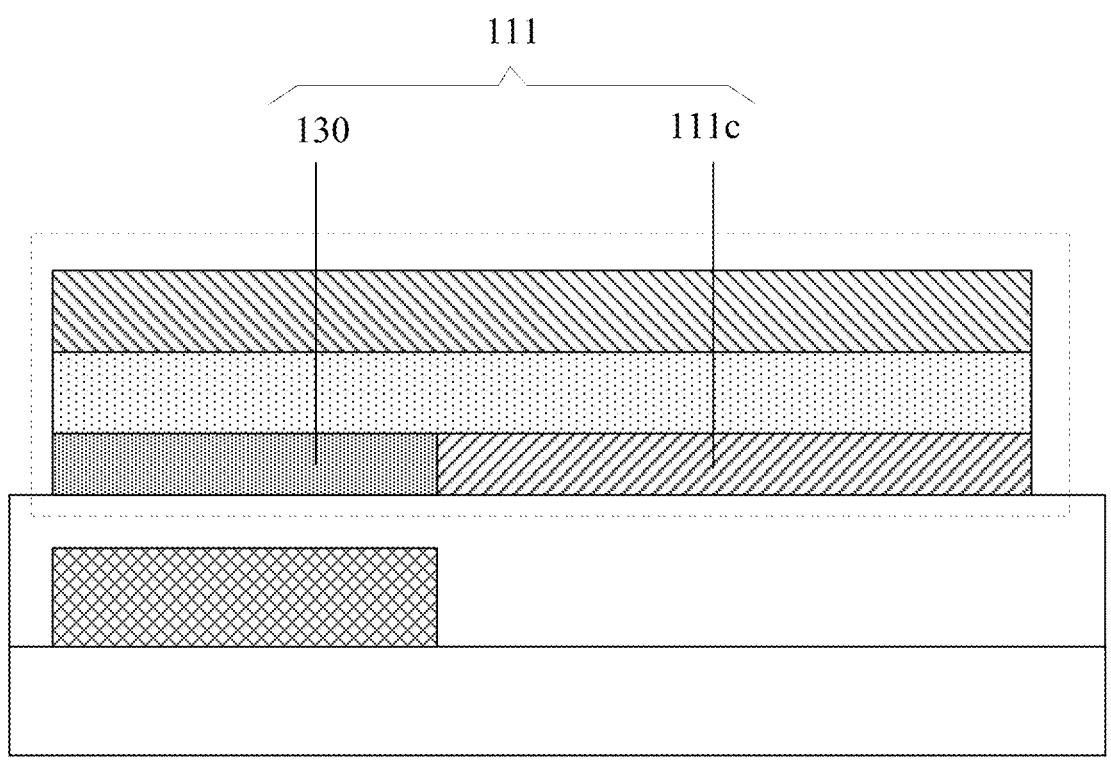
FIG. 3g is a schematic partial sectional diagram of a transparent display panel in an embodiment of this disclosure.

FIG. 3g shows a schematic structural diagram of a transparent display panel corresponding to this embodiment, in which the implementation of the reflection layer 130 in Embodiment 1 is modified. Only the differences of this embodiment from Embodiment 1 are explained below, and the similarities of this embodiment to Embodiment 1 are not repeated herein.

In a specific implementation, in the embodiment of this disclosure, as shown in FIG. 3g, the anode layer 111 includes a transparent anode layer 111c only located in the transparent region A; and the reflection layer 130 is electrically connected to the transparent anode layer 111c and serves as a reflective anode layer. That is, the transparent anode layer 111c and the reflection layer 130 together constitute the anode layer 111. The material of the reflection layer 130 can include metal such as one or a combination of Al, Ag and Mo.

Based on the same inventive concept, this disclosure further provides a display device including the transparent display panel mentioned above. The display device may be a mobile phone, a tablet computer, a television, a notebook computer, a digital photo frame, or any product or component having a display function. Other essential components of the display device are understandable for those ordinarily skilled in the art, will not be repeated anymore, and should not be regarded as limitations of this disclosure. The display device can be implemented with reference to the embodiments of the transparent display panel, and repeated details will not be given anymore.

According to the transparent display panel and the display device according to this disclosure, the overlap region is formed between the orthographic projection of the light-emitting region of the electroluminescent structure on the base substrate and the orthographic projection of the region of the pixel circuit on the base substrate, the area occupied by the electroluminescent structures in the sub-pixels is enlarged, thus increasing the pixel aperture ratio of the transparent display panel at the sides of the electroluminescent structures away from the pixel circuits.

Obviously, various modification and variations of this disclosure can be made by those skilled in the art without deviating from the spirit and scope of this disclosure. This disclosure is intended to include all these modifications and variations which fall within the scope defined by the appended claims and their equivalents.

The invention claimed is:

1. A transparent display panel, comprising:
a base substrate, wherein a plurality of sub-pixels are on the base substrate;
a plurality of pixel circuits, located respectively in the sub-pixels; and
a plurality of electroluminescent structures, located respectively in the sub-pixels, electroluminescent structures and the pixel circuits being stacked, wherein a light-emitting region of at least one of the electroluminescent structures comprises a transparent region and an overlap region, and the overlap region is a region where an orthographic projection of the light-emitting region on the base substrate and an orthographic projection of a region of the pixel circuit on the base substrate overlaps with each other;
wherein the transparent display panel further comprises: a reflection layer in at least one of the sub-pixels; wherein at least one of the electroluminescent structures comprises an anode layer, an electroluminescent layer and a transparent cathode layer which are stacked; the reflection layer is between a layer of the pixel circuit and the electroluminescent layer; and in a same sub-pixel, an orthographic projection of the reflection layer on the base substrate covers the overlap region;
wherein the anode layer is a transparent anode layer which is arranged in a whole light-emitting region; the reflection layer is between the transparent anode layer and the layer of the pixel circuit and is float and the transparent display panel further comprises a first insulation layer between the reflection layer and the layer of the pixel circuit, and a second insulation layer between the reflection layer and the anode layer; or,
wherein the anode layer is a transparent anode layer which is arranged in a whole light-emitting region; the reflection layer is between the anode layer and the layer of the pixel circuit; the transparent display panel further comprises a first insulation layer between the reflection layer and the layer of the pixel circuit, and a second insulation layer between the reflection layer and the anode layer; and in the same sub-pixel, the anode layer is electrically connected to the reflection layer through a first via hole penetrating through the second insulation layer; or,
wherein the anode layer comprises a transparent anode layer which is only arranged in the transparent region; the reflection layer is electrically connected to the transparent anode layer and serves as a reflective anode layer; an orthographic projection of the transparent anode layer on the base substrate is not overlapped with an orthographic projection of the reflection layer on the base substrate; and the transparent anode layer and the reflection layer are arranged on a same layer; or,
wherein the reflection layer is between the anode layer and the layer of the pixel circuit the transparent display panel further comprises a first insulation layer between the reflection layer and the layer of the pixel circuit, a second insulation layer between the reflection layer and the anode layer, and a pixel defining layer in at least one of the sub-pixels; and the transparent cathode layer is electrically connected to the reflection layer through a second via hole penetrating through the pixel defining layer and the second insulation layer.

2. The transparent display panel according to claim 1, further comprising an encapsulation structure covering the pixel circuits and the electroluminescent structures;
the encapsulation structure comprises:
a thin film encapsulation, a glass encapsulation, or a soft substrate encapsulation.

3. The transparent display panel according to claim 1, wherein in the same sub-pixel, the orthographic projection of the light-emitting region of the electroluminescent structure on the base substrate covers the orthographic projection of the region of the pixel circuit on the base substrate.

4. The transparent display panel according to claim 1, further comprising an encapsulation structure covering the pixel circuits and the electroluminescent structures;
the encapsulation structure comprises:
a thin film encapsulation, a glass encapsulation, or a soft substrate encapsulation.

5. The transparent display panel according to claim 1, wherein the orthographic projection of the reflection layer on the base substrate coincides with the overlap region.

6. The transparent display panel according to claim 1, wherein colors of light emitted by the electroluminescent layers in all the sub-pixels comprise:
red, green and blue;
red, green, blue and white; or
white.

7. The transparent display panel according to claim 1, wherein the orthographic projection of the reflection layer on the base substrate coincides with the overlap region.

8. The transparent display panel according to claim 1, wherein a material of the reflection layer comprises one or more of Al, Ag and Mo.

9. A display device, comprising the transparent display panel according to claim 1.

* * * * *